(12) United States Patent
Kim et al.

(10) Patent No.: US 11,096,283 B2
(45) Date of Patent: Aug. 17, 2021

(54) SUBSTRATE ON SUBSTRATE STRUCTURE AND ELECTRONIC DEVICE COMPRISING THE SAME

(71) Applicant: SAMSUNG ELECTRO-MECHANICS CO., LTD., Suwon-si (KR)

(72) Inventors: Yong Hoon Kim, Suwon-si (KR); Seung Eun Lee, Suwon-si (KR); Young Kwan Lee, Suwon-si (KR); Hak Chun Kim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 16/795,974

(22) Filed: Feb. 20, 2020

(65) Prior Publication Data

US 2021/0185815 A1 Jun. 17, 2021

(30) Foreign Application Priority Data

Dec. 11, 2019 (KR) .................. 10-2019-0164684

(51) Int. Cl.
*H05K 1/14* (2006.01)
*H01L 23/498* (2006.01)
*H05K 1/02* (2006.01)

(52) U.S. Cl.
CPC ....... *H05K 1/145* (2013.01); *H01L 23/49816* (2013.01); *H01L 23/49833* (2013.01);
(Continued)

(58) Field of Classification Search
CPC ............. H05K 1/14; H05K 1/141–145; H05K 1123/49833
See application file for complete search history.

(56) References Cited

U.S. PATENT DOCUMENTS 8,217,500 B1 7/2012 Hool
2009/0057881 A1* 3/2009 Arana ................. H01L 25/0657
257/714

(Continued)

FOREIGN PATENT DOCUMENTS

JP 4885425 B2 2/2012
KR 10-1411813 B1 6/2014
KR 10-2019-0043892 A 4/2019

*Primary Examiner* — Hoa C Nguyen
(74) *Attorney, Agent, or Firm* — Morgan, Lewis & Bockius LLP

(57) ABSTRACT

A substrate-on-substrate structure and an electronic device including the same are provided, and the substrate-on-substrate structure includes: a first printed circuit board having a first side and a second side, opposite to the first side; a second printed circuit board disposed on the second side of the first printed circuit board, and having a first side connected to the second side of the first printed circuit board and a second side opposite to the first side connected to the second side of the first printed circuit board; a first structure disposed on the second side of the first printed circuit board, and disposed around the second printed circuit board; a second structure disposed on the second side of the second printed circuit board; and a third structure disposed on the first and second structures, and connected to each of the first and second structures.

18 Claims, 6 Drawing Sheets

(52) U.S. Cl.
CPC ........... *H05K 1/0209* (2013.01); *H05K 1/141* (2013.01); *H05K 1/144* (2013.01)

(56) References Cited

U.S. PATENT DOCUMENTS

| | | | |
|---|---|---|---|
| 2012/0007229 A1* | 1/2012 | Bartley | H01L 23/3677 |
| | | | 257/712 |
| 2014/0131856 A1 | 5/2014 | Do et al. | |
| 2017/0018505 A1* | 1/2017 | Lin | H01L 23/5389 |
| 2019/0122949 A1 | 4/2019 | Lee | |
| 2019/0385929 A1* | 12/2019 | Ku | H01L 25/18 |
| 2020/0152546 A1* | 5/2020 | Refai-Ahmed | H01L 23/367 |

* cited by examiner

SUBSTRATE ON SUBSTRATE STRUCTURE AND ELECTRONIC DEVICE COMPRISING THE SAME

CROSS-REFERENCE TO RELATED APPLICATION(S)

This application claims benefit of priority to Korean Patent Application No. 10-2019-0164684 filed on Dec. 11, 2019 in the Korean Intellectual Property Office, the disclosure of which is incorporated herein by reference in its entirety.

TECHNICAL FIELD

The present inventive concept relates to a substrate-on-substrate structure, and an electronic device including the same.

BACKGROUND

According to the number of I/Os and integration, increased due to the high performance of electronic products, high degrees of layering and a large size of a substrate are required in a substrate. For example, increases in the size and number of layers of a flip chip ball grid array (FCBGA) substrate for high performance semiconductors are required, and thus, a problem may occur in that cost increases due to an increase in technical difficulty and a decrease in yield. Therefore, there is a need for a technique capable of reducing costs while maintaining semiconductor performance. In addition, according to high degrees of layering and a large size of a substrate, the warpage characteristics and heat dissipation characteristics of a substrate have also emerged as important characteristics. Therefore, there is demand for a technique capable of improving the warpage characteristics and heat dissipation characteristics of a substrate.

SUMMARY

An aspect of the present inventive concept is to provide a substrate-on-substrate structure capable of coping with high degrees of layering and a large size of a substrate, and an electronic device including the same.

Another aspect of the present inventive concept is to provide a substrate-on-substrate structure capable of reducing costs, and an electronic device including the same.

Moreover, a substrate-on-substrate structure capable of improving warpage and/or heat dissipation characteristics, and an electronic device including the same may be provided.

According to an aspect of the present inventive concept, a printed circuit board is stacked on a printed circuit board to provide a substrate-on-substrate structure.

According to another aspect of the present inventive concept, in the substrate-on-substrate structure, first and second structures, functioning as reinforcing members, are disposed on each printed circuit board, and a third structure, functioning as a heat dissipation member, is disposed on the first and second structures to be connected to each of the first and second structures.

For example, a substrate-on-substrate structure according to an embodiment includes: a first printed circuit board having a first side and a second side, opposite to the first side; a second printed circuit board disposed on the second side of the first printed circuit board, and having a first side connected to the second, side of the first printed circuit board and a second side opposite to the first side connected to the second side of the first printed circuit board; a first structure disposed on the second side of the first printed circuit board, and disposed around the second printed circuit board; a second structure disposed on the second side of the second printed circuit board; and a third structure disposed on the first and second structures, and connected to each of the first and second structures.

For example, an electronic device according to an embodiment includes: a mainboard; a first printed circuit board disposed on the mainboard; a second printed circuit board disposed on the first printed circuit board; a first structure disposed around the second printed circuit board on the first printed circuit board; an electronic component disposed on the second printed circuit board; a second structure disposed around the electronic component on the second printed circuit board; and a third structure disposed on the first and second structures, and connected to the first and second structures.

For example, an electronic device according to an embodiment includes: a first printed circuit board; a second printed circuit board disposed on the first printed circuit board; an electronic component disposed on the second printed circuit board, the second printed circuit board being disposed between the first printed circuit board and the electronic component; a first structure disposed on the first printed circuit board and surrounding side surfaces of the second printed circuit board; and a second structure disposed on the second printed circuit board and surrounding side surfaces of the electronic component. The second structure is disposed between the electronic component and the first structure, and is spaced apart from the first structure and the electronic component.

BRIEF DESCRIPTION OF DRAWINGS

The above and other aspects, features and other advantages of the present disclosure will be more clearly understood from the following detailed description, taken in conjunction with the accompanying drawings, in which.

DETAILED DESCRIPTION

Figure 1:
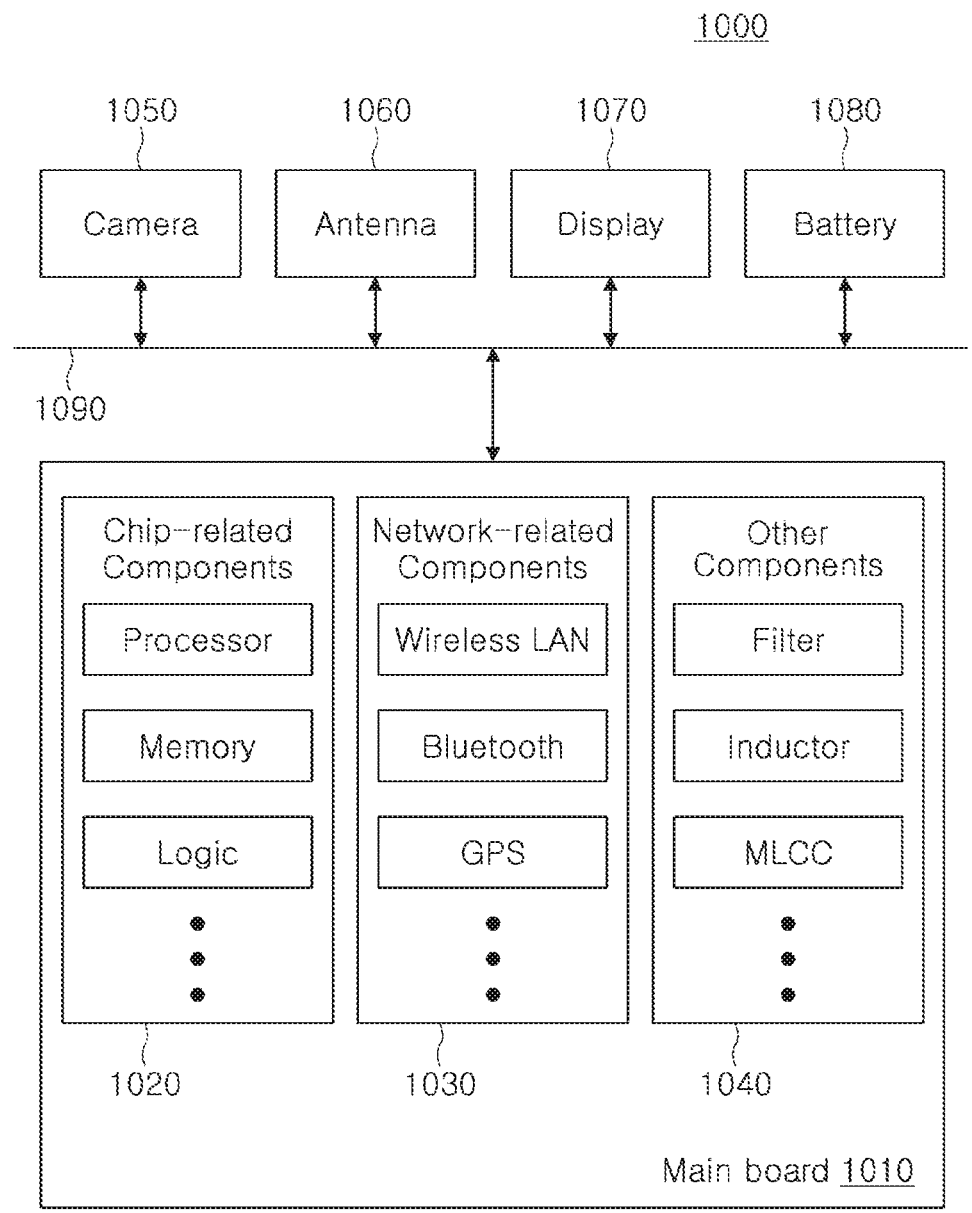
FIG. 1 is a schematic block diagram illustrating an example of an electronic device system.

Hereinafter, embodiments of the present disclosure will be described as follows with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" other elements would then be oriented "below," or "lower" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein describes particular embodiments only, and the present disclosure is not limited thereby. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present disclosure will be described with reference to schematic views illustrating embodiments of the present disclosure. In the drawings, for example, due to manufacturing techniques and/or tolerances, modifications of the shape shown may be estimated. Thus, embodiments of the present disclosure should not be construed as being limited to the particular shapes of regions shown herein, for example, to include a change in shape results in manufacturing. The following embodiments may also be constituted by one or a combination thereof.

The contents of the present disclosure described below may have a variety of configurations and propose only a required configuration herein, but are not limited thereto.

FIG. 1 is a block diagram schematically illustrating an example of an electronic device system.

Referring to FIG. 1, an electronic device 1000 may accommodate a mainboard 1010 therein. The mainboard 1010 may include chip-related components 1020, network-related components 1030, other components 1040, or the like, physically or electrically connected thereto. These electronic components may be connected to others to be described below to form various signal lines 1090.

The chip-related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, microprocessor, a microcontroller, or the like; and a logic chip such as an analog-to-digital converter, an application-specific integrated circuit (ASIC), or the like. However, the chip-related components 1020 are not limited thereto, and may include other types of chip-related electronic components. In addition, the chip-related components 1020 may be combined with each other. The chip-related components 1020 may have a package form including the above-mentioned chip or electronic component.

The network-related components 1030 may include protocols such as wireless fidelity (Wi-Fi) (institute of electrical and electronics engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the above-mentioned protocols. However, the network-related components 1030 are not limited thereto, but may also include a variety of other wireless or wired standards or protocols. In addition, the network-related components 1030 may be combined with each other, together with the chip-related electronic components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components in the form of a chip component used for various other purposes, or the like. In addition, other components 1040 may be combined with each other, together with the chip-related electronic components 1020 or the network-related electronic components 1030 described above.

Depending on a type of the electronic device 1000, the electronic device 1000 includes other electronic components that may or may not be physically or electrically connected to the mainboard 1010. As an example of other electronic components, a camera module 1050, an antenna module 1060, a display 1070, a battery 1080, and the like may be provided. However, the other electronic components are not limited thereto, and may be an audio codec, a video codec, a power amplifier, a compass, an accelerometer, a gyroscope, a speaker, a mass storage device (for example, a hard disk drive), a compact disk (CD), a digital versatile disk (DVD), or the like. In addition, other electronic components, used for various purposes, may be included according to the type of the electronic device 1000.

The electronic device 1000 may be a smartphone, personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device able to process data.

Figure 2:
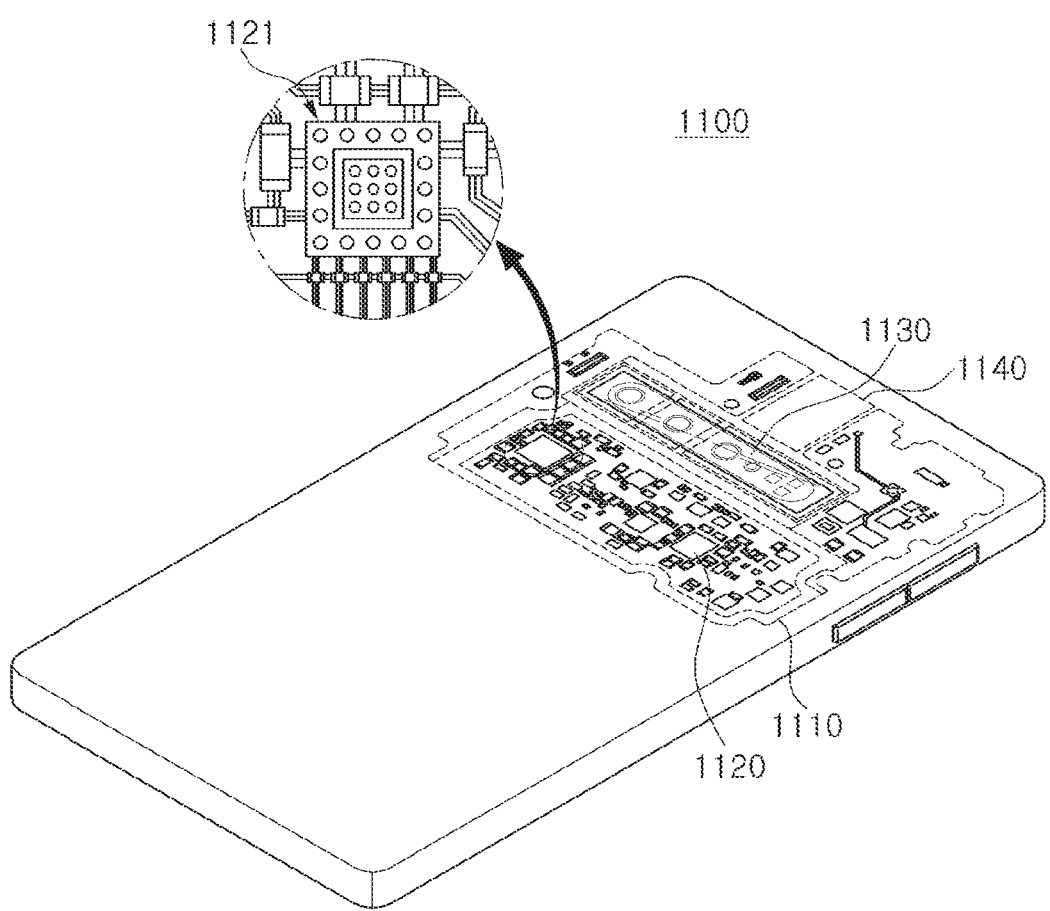
FIG. 2 is a schematic perspective view illustrating an example of an electronic device.

FIG. 2 is a schematic perspective view illustrating an example of an electronic device.

Referring to FIG. 2, an electronic device may be, for example, a smartphone 1100. A mainboard 1110 may be accommodated in a smartphone 1100, and various electronic components 1120 may be physically or electrically connected to the mainboard 1110. In addition, other components that may or may not be physically or electrically connected to the mainboard 1110, such as a camera module 1130 and/or a speaker 1140, may be accommodated therein. Some of the electronic components 1120 may be the chip-related components described above, for example, a semiconductor package 1121, but are not limited thereto. The semiconductor package 1121 may be a package substrate in the form of a multilayer printed circuit board or may have a form in which a semiconductor chip or passive component is mounted on a surface of a substrate-on-substrate structure including the same, but is not limited thereto. On the other hand, the electronic device is not necessarily limited to the smartphone 1100, but may be other electronic devices as described above.

Figure 3:
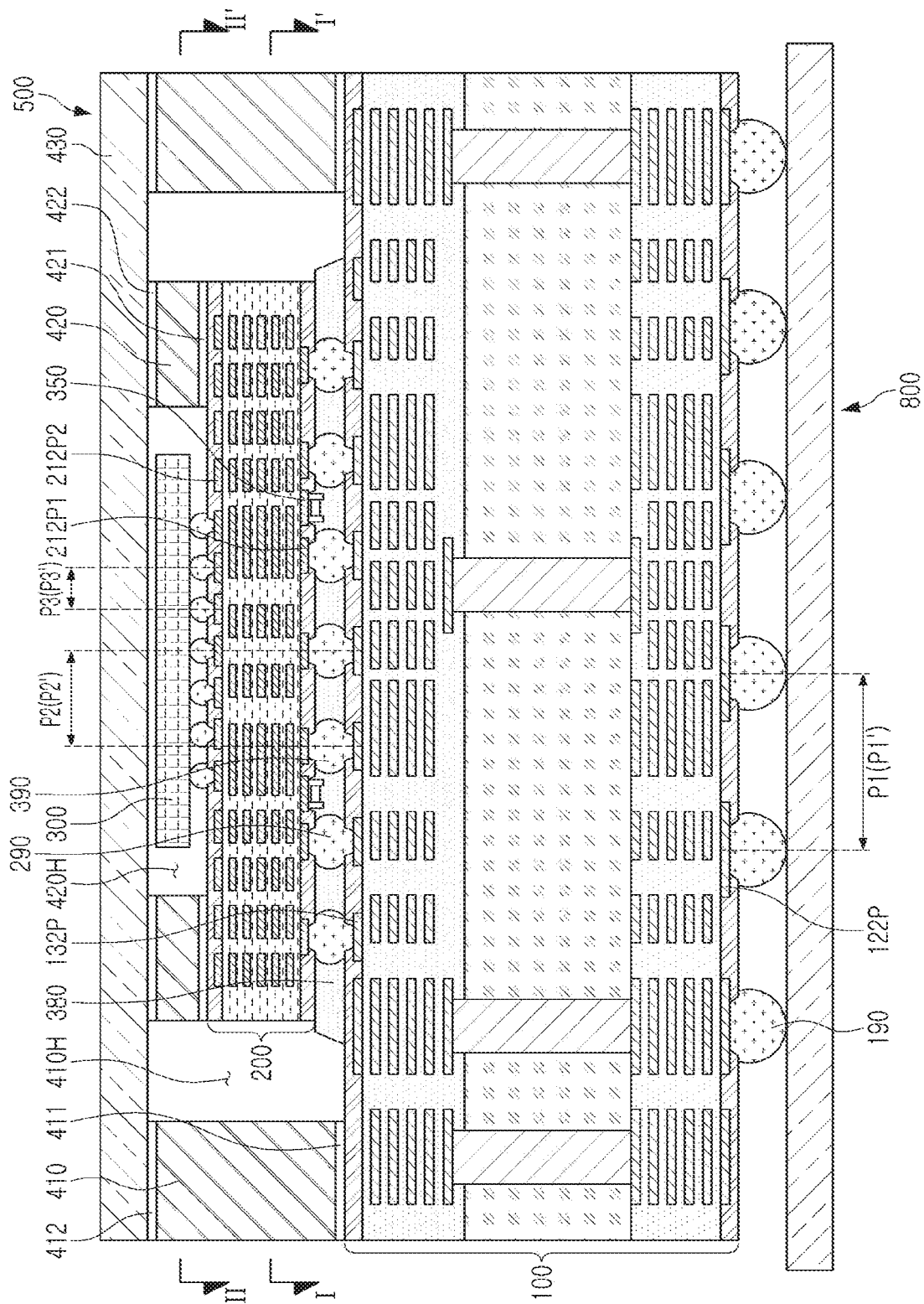
FIG. 3 is a schematic cross-sectional view illustrating an example of a substrate-on-substrate structure.

FIG. 3 is a schematic cross-sectional view illustrating an example of a substrate-on-substrate structure.

Figure 4:
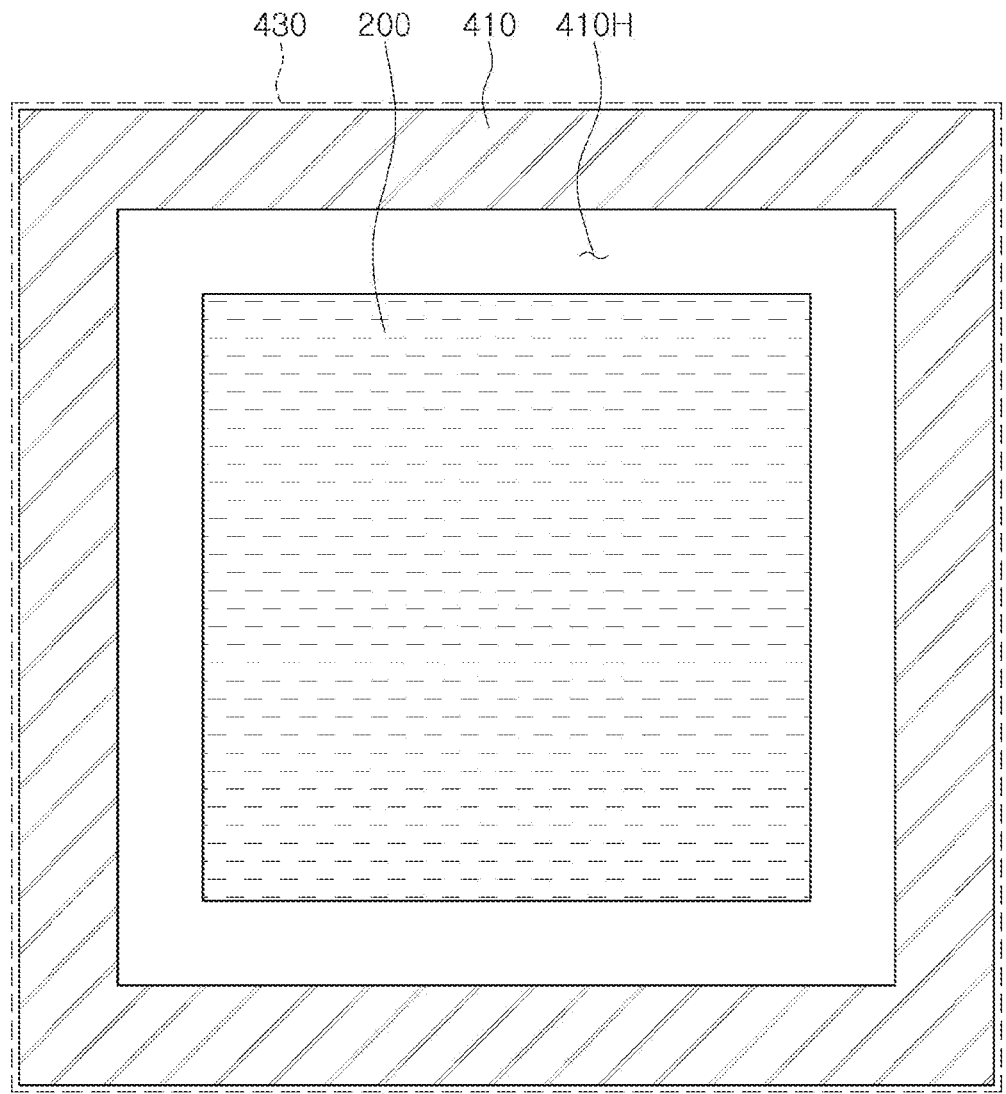
FIG. 4 is a schematic plan view taken along line I-I' of the substrate-on-substrate structure of FIG. 3.

FIG. 4 is a schematic plan view taken along line I-I' of the substrate-on-substrate structure of FIG. 3.

Figure 5:
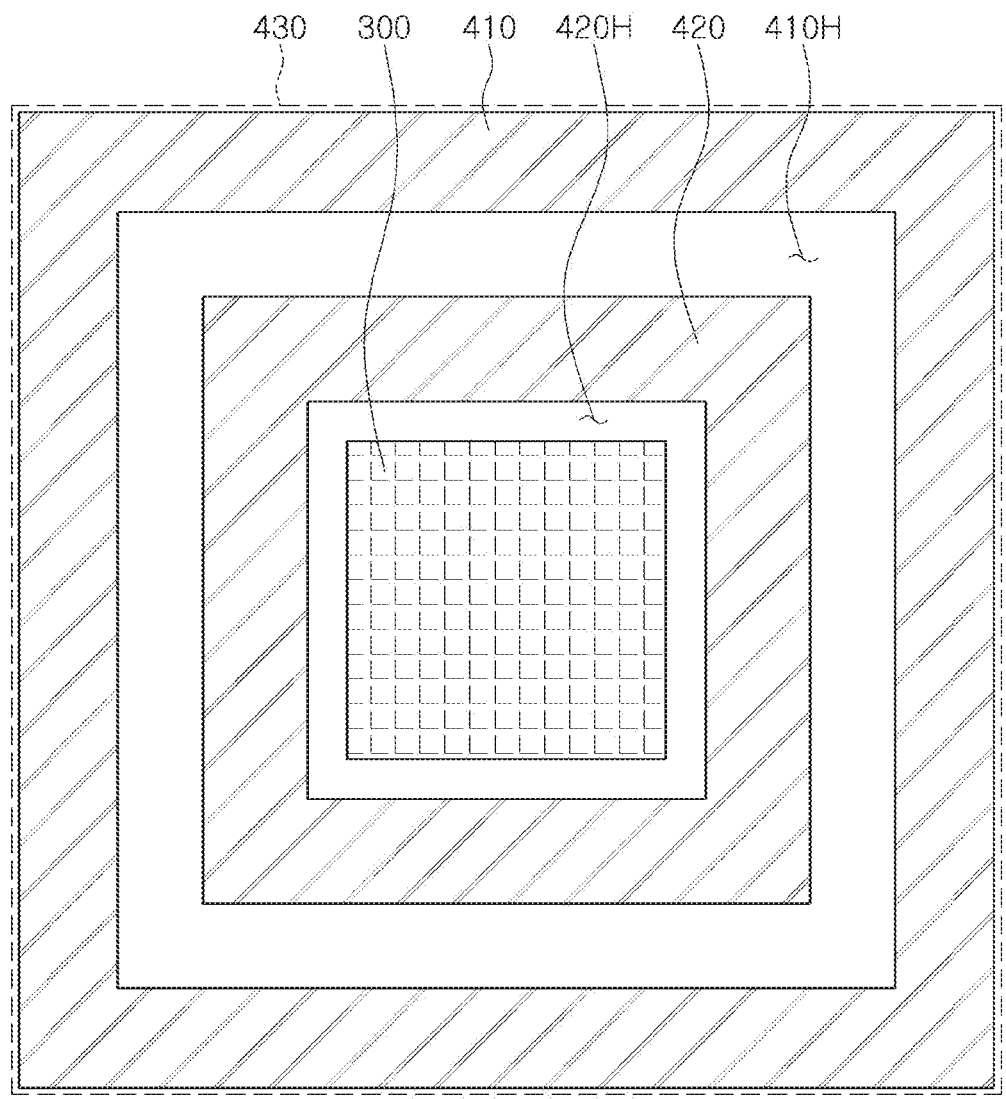
FIG. 5 is a schematic plan view taken along line II-II' of the substrate-on-substrate structure of FIG. 3.

FIG. 5 is a schematic plan view taken along line II-II' of the substrate-on-substrate structure of FIG. 3.

Referring to the drawings, a substrate-on-substrate structure 500 according to an embodiment includes a first printed circuit board 100, a second printed circuit board 200 disposed on the first printed circuit board 100, a first structure 410 disposed on the first printed circuit board 100, a second structure 420 disposed on the second printed circuit board 200, and a third structure 430 disposed on the first and second structures 410 and 420 and connected to the first and second structures, respectively. In this case, each of the first and second structures 410 and 420 may be a reinforcing member such as a stiffener. Moreover, the third structure 430 may be a heat dissipation member such as heat slug, a heat sink, a heat spreader, or the like.

As described above, the substrate-on-substrate structure 500 according to an embodiment may have a stacked structure of the first and second printed circuit boards 100 and 200 corresponding to high degrees of layering and a large size. Thus, as compared with the case in which a substrate having high degrees of layering and a large size is manufactured through simply one printed circuit board, the difficulty of the technology may be lowered, the yield may be increased, and as a result, costs may be reduced. In addition, the wiring designs of the first printed circuit board 100 and the second printed circuit board 200 are different from each other, the optimal wiring design may be achieved, and as a result, more excellent performance may be provided. In addition, the first and second structures 410 and 420, which may function as reinforcing members, are disposed on the first and second printed circuit boards 100 and 200, respectively, and thus warpage characteristics may be effectively improved. Moreover, a third structure 430, which may function as a heat dissipation member, is disposed on the first and second structures 410 and 420, and thus heat dissipation characteristics may also be effectively improved.

An electronic component 300 may be provided on the second printed circuit board 200. For example, the substrate-on-substrate structure 500 according to an embodiment may function as a package substrate. The electronic component 300 may be a known active and/or passive component. The electronic component 300 may be semiconductor chip, for example, a memory chip such as a volatile memory, a non-volatile memory, a flash memory, or the like, an application processor chip such as a central processor, a graphics processor, a digital signal processor, a cryptographic processor, a microprocessor, a microcontroller, or the like, or a logic chip such as an analog to digital converter, ASIC, or the like. However, an embodiment of the present disclosure is not limited thereto. The electronic component 300 may be arranged in a package form as necessary. Moreover, the electronic component 300 may be provided as a plurality of electronic components, and the respective electronic components may be the same type or different types.

The first structure 410 may be disposed around the second printed circuit board 200 on the first printed circuit board 100. For example, the first structure 410 may have a first through portion 410H, while the second printed circuit board 200 may be disposed in the first through portion 410H. Through this arrangement, while the influence on the arrangement of the second printed circuit board 200 is significantly reduced, a size of the first structure 410 may be sufficiently ensured. In one example, the second structure 420 may be disposed in the first through portion 410H. Meanwhile, if necessary, empty spaces for dividing the first structure 410 into a plurality of units may be formed in the intervals of the first structure 410, and in this case, the first through portion 410H may be connected to each of the empty spaces.

The second structure 420 may be disposed around the electronic component 300 on the second printed circuit board 200. For example, the second structure 420 may have a second through portion 420H, while the electronic component 300 may be disposed in the second through portion 420H. Through this arrangement, while the influence on the arrangement of the electronic component 300 is significantly reduced, a size of the second structure 420 may be sufficiently ensured. Meanwhile, if necessary, empty spaces for dividing the second structure 420 into a plurality of units may also be formed in the intervals of the second structure 420, and in this case, the second through portion 420H may be connected to each of the empty spaces.

Each of the first and second structures 410 and 420 may include a metal and/or ceramic material as a material. In this case, excellent rigidity maintenance and minimization of the difference in thermal expansion coefficients may be effective in warpage control. Moreover, in the case of a metal and/or ceramic-based material, since the thermal conductivity is excellent as compared with a molding resin or insulating resin according to the related art, the heat dissipation characteristics may also be improved. In addition, a process of formation of the first and second through portions 410H and 420H may be performed using an etching process rather than a laser drill process, and thus a foreign material defect may be fundamentally removed. As a metal-based material, an alloy having excellent rigidity and thermal conductivity may be used in addition to a general metallic material such as copper (Cu) or aluminum (Al). In this case, an alloy containing at least iron may be used. For example, a Fe—Nibased alloy, Invar or Kovar, may be used, but is not limited thereto. In addition, in the case of using a ceramic-based material such as a zirconia-based ($ZrO_2$), alumina ($Al_2O_3$)-based, silicon carbide-based (SiC), silicon nitride-based ($Si_2N_4$) material, or the like, rather than an alloy, a similar effect may be provided. If necessary, a material may be an insulating material. For example, a material of the first and second structures 410 and 420 may be a thermosetting resin such as an epoxy resin, a thermoplastic resin such as a polyimide resin, or a resin in which the resin is impregnated together with an inorganic filler in a core material such as a glass fiber, for example, a prepreg. The first and second structures 410 and 420 may have more excellent rigidity as compared with an insulation material of a build-up layer of the second printed circuit board 200, and may have a greater elastic modulus, by way of example.

The third structure 430 may cover an upper side of the first printed circuit board 100, an upper side of the second printed circuit board 200, and an upper side of the electronic component 300. For example, the third structure 430 has the form of a heat sink and may be connected to each of the first and second structures 410 and 420, and may thus cover an upper side of the substrate-on-substrate structure 500 according to an embodiment. In this regard, a heat dissipation effect may be implemented more effectively.

The third structure 430 may include a metal-based material. In this case, due to high thermal conductivity, the excellent heat dissipation effect may be provided. The metal-based material may be copper (Cu), aluminum (Al), silver (Ag), tin (Sn), gold (Au), nickel (Ni), lead (Pb), titanium (Ti), alloys thereof, or an alloy containing at least one of them. However, an embodiment of the present disclosure is not limited thereto, and various materials having high thermal conductivity may be used, for example, a graphite-based material such as a graphene sheet.

The first structure 410 may be attached to the first printed circuit board 100 through a first adhesive member 411, and may be attached to the third structure 430 through a second adhesive member 412. Moreover, the second structure 420 may be attached to the second printed circuit board 200 through a third adhesive member 421, and may be attached to the third structure 430 through a fourth adhesive member 422. In this regard, the first to third structures 410, 420, and 430 may be more stably fixed. The first to fourth adhesive members 411, 412, 421, and 422 may be, for example, an epoxy resin-based adhesive, a silicone resin-based adhesive, or the like, but are not limited thereto. Alternatively, adhesives, formed of various materials, may be used, as long as the adhesives may attach and fix the first to third structures 410, 420, and 430.

The first printed circuit board 100 may be mounted on a mainboard 800 through a plurality of first electrical connection metals 190 having a first pitch P1. In addition, the second printed circuit board 200 may be mounted on the first printed circuit board 100 through a plurality of second electrical connection metals 290 having a second pitch P2. Moreover, the electronic component 300 may be mounted on the second printed circuit board 200 through a third electrical, connection metal 390 having a third pitch P3. The first pitch P1 may be greater than the second pitch P2, and the second pitch P2 may be greater than the third pitch P3. As described above, the substrate-on-substrate structure 500 according to an embodiment may be mounted on a mainboard 800 of an electronic device such as a smartphone, described above. In this case, the first printed circuit board 100 may have a larger scale than the second printed circuit board 200, while the second printed circuit board 200 may have a larger scale than the electronic component 300. For example, the first printed circuit board 100 may have a greater thickness than the second printed circuit board 200. In addition, the first printed circuit board 100 may have a wider planar area than the second printed circuit board 200.

The first printed circuit board 100 may include a plurality of first pads 122P having a first pitch P1' therebelow. In addition, the second printed circuit board 200 may include a plurality of first pads 212P1 having a second pitch P2' therebelow. Moreover, the second printed circuit board 200 may include a plurality of second pads 212P2 having a third pitch P3' thereabove. Meanwhile, the first printed circuit board 100 may include a plurality of second pads 132P thereabove, and the plurality of second pads 132P may have the same pitch as the second pitch P2', but is not limited thereto, and there may be a factory error due to alignment or the like. The plurality of first pads 122P of the first printed circuit board 100 may be connected to a plurality of first electrical connection metals 190, respectively. Each of a plurality of second pads 132P of the first printed circuit board 100 and a plurality of first pads 212P1 of the second printed circuit board 200 may be connected to the second electrical connection metal 290. Each of the plurality of second pads 212P2 of the second printed circuit board 200 may be connected to a third electrical connection metals 390. Thus, the first pitch P1' may be greater than the second pitch P2', and the second pitch P2' may be greater than the third pitch P3'. The first pitch P1 and the first pitch P1' are the same as each other, but there may be a process error due to alignment. This may be the same in the relationship between the second pitch P2 and the second pitch P2', and the relationship between the third pitch P3 and the third pitch P3'.

A passive component 350 may be, surface mounted below the second printed circuit board 200. The passive component 350 may be electrically connected to the electronic component 300 through internal wiring of the second printed circuit board 200. The passive component 350 may be a chip type known inductor or capacitor, which may be surface mounted. Through the arrangement of the passive component 350, electrical characteristics of the electronic component 300, for example, power integrity (PI) may be improved.

An underfill resin 380, covering at least a portion of each of the second electrical connection metal 290 and the passive component 350, may be disposed between the first printed circuit board 100 and the second printed circuit board 200. The second printed circuit board 200 may be stably fixed to the first printed circuit board 100 through the underfill resin 380, the passive component 350 is also stable fixed, and the second electrical connection metal 290 and the passive component 350 may be protected. The underfill resin 380 may include a thermosetting resin such as an epoxy resin, but is not limited thereto.

Alternatively, other materials may also be used for the underfill resin, as long as the underfill resin is disposed between the first and second printed circuit boards 100 and 200 to embed and fix a plurality of second electrical connection metals 290 and/or passive components 350.

Figure 6:
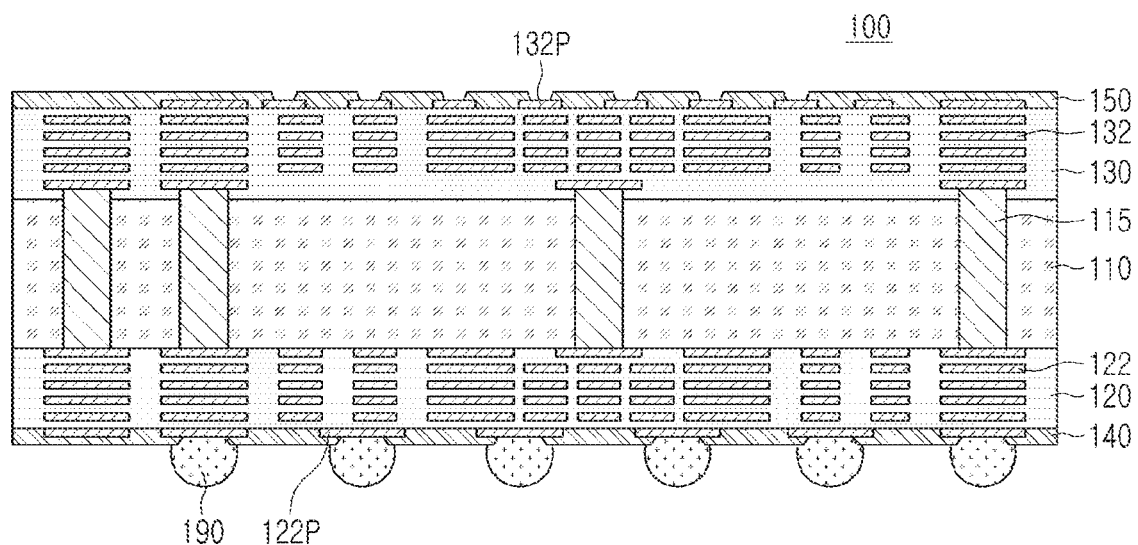
FIG. 6 is a schematic cross-sectional view illustrating an example of a first printed circuit board of FIG. 3.

FIG. 6 is a schematic cross-sectional view illustrating an example of a first printed circuit board of FIG. 3.

Referring to FIG. 6, a first printed circuit board 100 according to an embodiment may be a core type printed circuit board (a cored PCB). For example, the first printed circuit board 100 according to an embodiment includes a core layer 110, a first build-up layer 120 disposed below the core layer 110, a second build-up layer 130 disposed above the core layer, a plurality of first wiring layers 122 embedded in the first build-up layer 120, a plurality of second wiring layers 132 embedded in the second build-up layer 130, and a through via 115 electrically connecting the plurality of first and second wiring layers 122 and 132 while passing through the core layer 110. Layers, vertically adjacent to each other, of each of the plurality of first and second wiring layers 122 and 132 may be electrically connected to each other through vias including a plurality of layers passing through the first and second build-up layers 120 and 130. The first passivation layer 140 may be disposed on the first build-up layer 120. The second passivation layer 150 may be disposed on the second build-up layer 130. The first passivation layer 140 may have a plurality of first openings exposing first pads 122P, respectively, and first electrical connection metals 190 are disposed on the first openings to be connected to the first pads 122P, respectively. The second passivation layer 150 may have a plurality of second openings exposing second pads 132P, respectively, and second electrical connection metals 290, to be described later, are disposed on the second openings to be connected to the second pads 132P, respectively. Meanwhile, the first printed circuit board 100 according to an embodiment does not necessarily have to be a core type, but may also be a coreless type.

The core layer 110 may be a cover board, the center of the first printed circuit board 100 according to an embodiment. For example, an insulating material may be used as the material of the core layer 110. In this case, the insulating material may be a thermosetting resin such as an epoxy resin, a thermoplastic resin such as a polyimide resin, or a material including a reinforcing material such as a glass fiber, a glass cloth, a glass fabric, and/or an inorganic filler, for example, copper clad laminate (CCL), unclad CCL, or the like. However, it is not limited thereto, and, if necessary, the core layer 110 may be a metal plate or a glass plate, and may be a ceramic plate. If necessary, a material of the core layer 110 may be a liquid crystal polymer (LCP). The core layer 110 may be thicker than a thickness of each insulating layer, forming the build-up layers 120 and 130, for the purpose of warpage control. Moreover, the core layer 110 may have more excellent rigidity as compared with each insulating layer, forming the build-up layers 120 and 130, for the purpose of warpage control. For example, the core layer 110 may have an elastic modulus greater than each insulating layer.

The build-up layers 120 and 130 may provide an insulating region for formation of a multilayer wiring on both sides based on the core layer 110. Each of the build-up layers 120 and 130 may include a plurality of insulating layers, and boundaries between the insulating layers may be clear or unclear. The material of the insulating layers may be an insulating material. In this case, each insulating material may be a thermosetting resin such as an epoxy resin, a thermoplastic resin such as a polyimide resin, or a material including a reinforcing material such as a glass fiber and/or an inorganic filler with the same, for example, prepreg, an Ajinomoto Build-up Film (ABF), or the like. If necessary, a material of the insulating layer may be a Photo Image-able Dielectric (PID) material. Meanwhile, the insulating layer may include the same material, or may include different materials.

A material of the wiring layers 122 and 132 may also be a metallic material such as copper (Cu), aluminum (Al), silver (Ag), tin (Sn), gold (Au), nickel (Ni), lead (Pb), titanium (Ti), or alloys thereof. The wiring layers 122 and 132 may be formed using a plating process, for example, an Additive Process (AP), a Semi AP (SAP), a Modified SAP (MSAP), Tenting (TT), or the like, and as a result, each wiring layer may include a seed layer, which is an electroless plating layer, and an electrolytic plating layer, formed based on the seed layer. The wiring layers 122 and 132 may perform various functions depending on designs of corresponding layers. For example, the wiring layer may include a ground pattern, a power pattern, a signal pattern, or the like. Here, the signal pattern may include various signals except for a ground pattern, a power pattern, or the like, and may include, for example, a data signal, or the like. Each pattern may include a line pattern, a plane pattern, and/or a pad pattern. A material of a via connected to the wiring layers 122 and 132 may be a metallic material, and the via is also formed using a plating process such as AP, SAP, MSAP, TT, or the Like. The via may also perform various functions depending on a design of the corresponding layer. For example, the via may include a wiring via for signal connection, a wiring via for ground connection, a wiring via for power connection, or the like. Each via may be completely filled with a metallic material, or the metallic material may be formed along a wall of a via hole. Moreover, all shapes known in the related art, such as a tapered shape, or the like, may be applied thereto.

The through via 115 may connect wiring layers 122 and 132, disposed below and above the core layer 110, respectively, to each other while passing through the core layer 110. A material of the through via 115 may also be a metallic material such as copper (Cu), aluminum (Al), silver (Ag), tin (Sn), gold (Au), nickel (Ni), lead (Pb), titanium (Ti), or alloys thereof. Each through via 115 may also be formed using a plating process such as AP, SAP, MSAP, TT, or the like, and as a result, each through via layer may include a seed layer, an electroless plating layer, and an electrolytic plating layer formed based on the seed layer. The through via 115 may include a through-via for signal connection, a through-via for ground connection, a through-via for power connection, or the like. The through via 115 may have a cylindrical shape, an hourglass shape, or the like. If necessary, an insulating material may be filled in the through via 115.

The passivation layers 140 and 150 are additional components which can protect an internal configuration of the first printed circuit board 100 according to an embodiment from external physical and chemical damage. Each of the passivation layers 140 and 150 may include a thermosetting resin. For example, each of the passivation layers 140 and 150 may be an Ajinomoto buildup film (ABF). However, it is not limited thereto, and each of the passivation layers 140 and 150 may be a known Solder Resist (SR) layer. Moreover, if necessary, the PID may be included therein. Each of the passivation layers 140 and 150 may include a plurality of openings. Meanwhile, through the plurality of openings, a surface treatment layer may be formed on a surface of the exposed pads 122P and 132P. The surface treatment layer may be formed using, for example, electrolytic gold plating, electroless gold plating, Organic Solderability Preservative (OSP) or electroless tin plating, electroless silver plating, electroless nickel plating/replacement plating, Direct Immersion Gold (DIG) plating, Hot Air Solder Leveling (HASL), or the like. If necessary, each opening may be formed of a plurality of via holes. If necessary, an under bump metal (UBM) may be disposed on each opening to improve reliability.

The electrical connection metal 190 is an additional component which can physically and/or electrically connect the first printed circuit board 100 according to an embodiment to an outside. For example, the first printed circuit board 100 according to an embodiment may be mounted on another substrate such as a mainboard of an electronic device through the electrical connection metal 190. For example, the first printed circuit board 100 according to an embodiment may be a portion or the entirety of a Ball Grid Array (BGA) type package. Respective electrical connection metals 190 may be disposed on a plurality of openings of the passivation layers 140 and 150. Each of the electrical connection metals 190 may be formed of a low melting point metal as compared with copper (Cu), for example, tin (Sn) or an alloy including tin (Sn). For example, each of the electrical connection metals 190 may be formed of a solder, but it is only an example and a material therefor is not limited thereto.

Each of the electrical connection metals 190 may be a land, a ball, a pin, or the like. The electrical connection metals 190 may be formed as a multilayer or single layer structure. When the electrical connection metal includes the plurality of layers, the electrical connection metal includes a copper pillar and a solder. When the electrical connection metal includes the single layer, the electrical connection metal includes a tin-silver solder. However, the electrical connection metal is only an example, and the present disclosure is not limited thereto. The number, an interval, a disposition form, and the like, of the electrical connection metals 190 are not particularly limited, but may be sufficiently modified depending on design particulars by those skilled in the art.

Figure 7:
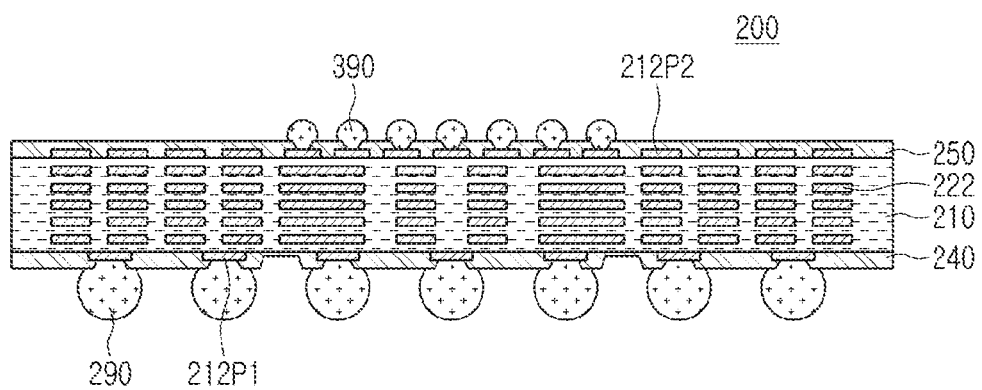
FIG. 7 is a schematic cross-sectional view illustrating an example of a second printed circuit board of FIG. 3.

FIG. 7 is a schematic cross-sectional view illustrating an example of a second printed circuit board of FIG. 3.

Referring to FIG. 7, a second printed circuit board 200 according to an embodiment may be a coreless type printed circuit board (a coreless PCB). For example, the second printed circuit board 200 according to an embodiment includes a build-up layer 210, and a plurality of wiring layers 222 embedded in the build-up layer 210. Layers, vertically adjacent to each other, of each of the plurality of wiring layers 222 may be electrically connected to each other through vias including a plurality of layers passing through the build-up layers 210. A first passivation layer 240 may be disposed below the build-up layer 210. A second passivation layer 250 may be disposed above the build-up layer 210. The first passivation layer 240 may have a plurality of first openings exposing first pads 212P1, respectively, and second electrical connection metals 290 are disposed on the first openings to be connected to the first pads 212P1, respectively. The second passivation layer 250 may have a plurality of second, openings exposing second pads 212P2, respectively, and third electrical connection metals 390 are disposed on the second openings to be connected to the second pads 212P2, respectively. Meanwhile, the second printed circuit board 200 according to an embodiment does not necessarily have to be a coreless type, but may also be a core type.

The build-up layer 210 may provide an insulating region for formation of a multilayer wiring. The build-up layer 210 may include a plurality of insulating layers, and boundaries between the insulating layers may be clear or unclear. The material of the insulating layers may be an insulating material. In this case, each insulating material may be a thermosetting resin such as an epoxy resin, a thermoplastic resin such as a polyimide resin, or a material including a reinforcing material such as a glass fiber and/or an inorganic filler with the same, for example, prepreg, an ABF, or the like. If necessary, a material of the insulating layer may be PID. Meanwhile, the insulating layer may include the same material, or may include different materials.

A material of the wiring layer 222 may be a metallic material, and, in this case, the metallic material may be copper (Cu), aluminum (Al), silver (Ag), tin (Sn), gold (Au), nickel (Ni), lead (Pb), titanium (Ti), or alloys thereof. The core wiring layer 222 may be formed using a plating process, for example, an Additive Process (AP), a Semi AP (SAP), a Modified SAP (MSAP), Tenting (TT), or the like, and as a result, each core wiring layer may include a seed layer, which is an electroless plating layer, and an electrolytic plating layer, which is formed based on the seed layer. The wiring layer 222 may perform various functions depending on a design of a corresponding layer. For example, the wiring layer may include a ground pattern, a power pattern, a signal pattern, or the like. Here, the S pattern may include various signals except for a GND pattern, a PWR pattern, or the like, and may include, for example, a data signal, or the like. Each pattern may include a line pattern, a plane pattern, and/or a pad pattern. A material of a via connected to the wiring layer 222 may be a metallic material, and the via is also formed using a plating process such as AP, SAP, MSAP, TT, or the like. The via may also perform various functions depending on a design of the corresponding layer. For example, the via may include a wiring via for signal connection, a wiring via for ground connection, a wiring via for power connection, or the like. Each via may be completely filled with a metallic material, or the metallic material may be formed along a wall of a via hole. Moreover, all of the shapes known in the related art, such as a tapered shape, or the like, may be applied thereto.

The passivation layers 240 and 250 are additional components which can protect an internal configuration of the second printed circuit board 200 according to an embodiment from external physical and chemical damage. Each of the passivation layers 240 and 250 may include thermosetting resin. For example, each of the passivation layers 240 and 250 may be an ABF. However, it is not limited thereto, and each of the passivation layers 240 and 250 may be a known SR layer. Moreover, if necessary, PID may be included therein. Each of the passivation layers 240 and 250 may include a plurality of openings. Meanwhile, through the plurality of openings, a surface treatment layer may be formed on a surface of the exposed pads 222P1 and 222P2. The surface treatment layer may be formed by, for example, electrolytic gold plating, electroless gold plating, OSP or electroless tin plating, electroless silver plating, electroless nickel plating/substituted gold plating, DIG plating, HASL, or the like. If necessary, each opening may be formed of a plurality of via holes. If necessary, an UBM may be disposed on each opening to improve reliability.

The electrical connection metals 290 and 390 are additional components which can physically and/or electrically connect the second printed circuit board 200 according to an embodiment to an outside. For example, the second printed circuit board 200 according to an embodiment may be mounted on another printed circuit board through the second electrical connection metal 290. Moreover, an electronic component may be mounted on the second printed circuit board 200 according to an embodiment through the third electrical connection metal 390. For example, the second printed circuit board 200 according to an embodiment may be a portion or the entirety of a BGA type package. Respective electrical connection metals 290 and 390 may be disposed on a plurality of openings of the passivation layers 240 and 250. Each of the electrical connection metals 290 and 390 may be formed of a low melting point metal as compared with copper (Cu), for example, tin (Sn) or an alloy including tin (Sn). For example, each of the electrical connection metals 290 and 390 may be formed of a solder, but it is only an example and a material therefor is not limited thereto.

Each of the electrical connection metals 290 and 390 may be a land, a ball, a pin, or the like. The electrical connection metals 290 and 390 may be formed as a multilayer or single layer structure. When the electrical connection metal includes the plurality of layers, the electrical connection metal includes a copper pillar and a solder. When the electrical connection metal includes the single layer, the electrical connection metal includes a tin-silver solder. However, the electrical connection metal is only an example, and the present disclosure is not limited thereto. The number, an interval, a disposition form, and the like, of the electrical connection metals 290 and 390 are not particularly limited, but may be sufficiently modified depending on design particulars by those skilled in the art.

As set forth above, according to example embodiments of the present inventive concept, a substrate-on-substrate structure capable of coping with high degrees of layering and a large size of a substrate, and an electronic device including the same may be provided.

In addition, a substrate-on-substrate structure capable of reducing costs, and an electronic device including the same may be provided.

Moreover, a substrate-on-substrate structure capable of improving warpage and/or heat dissipation characteristics, and an electronic device including the same may be provided.

While example embodiments have been shown and described above, it will be apparent to those skilled in the art that modifications and variations may be made without departing from the scope of the present disclosure, as defined by the appended claims.

What is claimed is:

1. A substrate-on-substrate structure, comprising:
a first printed circuit board having a first side and a second side, opposite to the first side;
a second printed circuit board disposed on the second side of the first printed circuit board, the second printed circuit board having a first side connected to the second side of the first printed circuit board, and the second printed circuit board having a second side, opposite to the first side of the second printed circuit board;
a first structure disposed on the second side of the first printed circuit board, and disposed around the second printed circuit board;
a second structure disposed on the second side of the second printed circuit board; and
a third structure disposed on the first and second structures, and connected to each of the first and second structures,
wherein the first printed circuit board includes a plurality of first pads having a first pitch in the first side of the first printed circuit board,
the second printed circuit board includes a plurality of second pads having a second pitch in the first side of the second printed circuit board and a plurality of third pads having a third pitch in the second side of the second printed circuit board, and
the second pitch is less than the first pitch and greater than the third pitch.

2. The substrate-on-substrate structure of claim 1, wherein the first structure is a reinforcing member including at least one of a metal or a ceramic,
the second structure is a reinforcing member including at least one of a metal or a ceramic, and
the third structure is a heat dissipation member including metal.

3. The substrate-on-substrate structure of claim 1, wherein the first structure has a first through portion in which the second printed circuit board is disposed.

4. The substrate-on-substrate structure of claim 1, further comprising:
an electronic component disposed on the second side of the second printed circuit board,
wherein the second structure is disposed around the electronic component.

5. The substrate-on-substrate structure of claim 4, wherein the second structure has a second through portion in which the electronic component is disposed.

6. The substrate-on-substrate structure of claim 1, wherein the third structure covers the second side of each of the first and second printed circuit boards.

7. The substrate-on-substrate structure of claim 1, wherein the first structure is attached to the first printed circuit board through a first adhesive member,
the first structure is attached to the third structure through a second adhesive member,
the second structure is attached to the second printed circuit board through a third adhesive member, and
the second structure is attached to the third structure through a fourth adhesive member.

8. The substrate-on-substrate structure of claim 1, wherein the first printed circuit board is a core type printed circuit board, and
the second printed circuit board is a coreless type printed circuit board.

9. The substrate-on-substrate structure of claim 8, wherein the first printed circuit board is thicker than the second printed circuit board.

10. The substrate-on-substrate structure of claim 1, wherein a planar area of the first printed circuit board is wider than the second printed circuit board.

11. The substrate-on-substrate structure of claim 1, further comprising:
a plurality of electrical connection metals disposed between the second side of the first printed circuit board and the first side of the second printed circuit board, and connecting the second printed circuit board to the second side of the first printed circuit board.

12. The substrate-on-substrate structure of claim 11, further comprising:
a passive component mounted on the first side of the second printed circuit board; and
an underfill resin disposed between the second side of the first printed circuit board and the first side of the second printed circuit board, and covering at least a portion of each of the plurality of electrical connection metals and the passive component.

13. An electronic device, comprising:
a mainboard; and
the substrate-on-substrate structure of claim 1 disposed on the mainboard.

14. The electronic device of claim 13, wherein the first printed circuit board is mounted on the mainboard through a plurality of first electrical connection metals having the first pitch,
the second printed circuit board is mounted on the first printed circuit board through a plurality of second electrical connection metals having the second pitch, and the electronic component is mounted on the second printed circuit board through a plurality of third electrical connection metals having the third pitch.

15. An electronic device, comprising:

a first printed circuit board;

a second printed circuit board disposed on the first printed circuit board;

an electronic component disposed on the second printed circuit board, the second printed circuit board being disposed between the first printed circuit board and the electronic component;

a first structure disposed on the first printed circuit board and surrounding side surfaces of the second printed circuit board;

a second structure disposed on the second printed circuit board and surrounding side surfaces of the electronic component;

a plurality of electrical connection metals disposed between the first printed circuit board and the second printed circuit board, and connecting the second printed circuit board to the first printed circuit board; and a passive component mounted on the second printed circuit board and between the second printed circuit board and the first printed circuit board, wherein the second structure is disposed between the electronic component and the first structure, and is spaced apart from the first structure and the electronic component, and the passive component is spaced apart from the plurality of electrical connection metals.

16. The electronic device of claim 15, further comprising a third structure disposed on the first and second structures, and covering the first and second structures and the electronic component.

17. The electronic device of claim 15, wherein the first structure and the second structure are made of a metal or a ceramic.

18. The electronic device of claim 15, wherein each of an elastic modulus of the first structure and of an elastic modulus of the second structure is greater than each of an elastic modulus of a build-up layer of the first printed circuit board and an elastic modulus of a build-up layer of the second printed circuit board.

* * * * *